(12) United States Patent
Quemere et al.

(10) Patent No.: US 11,055,842 B2
(45) Date of Patent: Jul. 6, 2021

(54) METHOD FOR IMPLEMENTING A CD-SEM CHARACTERISATION TECHNIQUE

(71) Applicant: COMMISSARIAT A L'ENERGIE ATOMIQUE ET AUX ENERGIES ALTERNATIVES, Paris (FR)

(72) Inventors: Patrick Quemere, Voreppe (FR); Jérôme Hazart, Eybens (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 49 days.

(21) Appl. No.: 16/469,868

(22) PCT Filed: Dec. 12, 2017

(86) PCT No.: PCT/EP2017/082427
§ 371 (c)(1),
(2) Date: Jun. 14, 2019

(87) PCT Pub. No.: WO2018/108912
PCT Pub. Date: Jun. 21, 2018

(65) Prior Publication Data
US 2019/0318472 A1    Oct. 17, 2019

(30) Foreign Application Priority Data

Dec. 15, 2016 (FR) ........................... 1662509

(51) Int. Cl.
*G06T 7/00* (2017.01)
*G06T 7/60* (2017.01)
(Continued)

(52) U.S. Cl.
CPC ............ *G06T 7/0006* (2013.01); *G06T 7/001* (2013.01); *G06T 7/60* (2013.01); *H01J 37/222* (2013.01);
(Continued)

(58) Field of Classification Search
CPC .. H01J 37/28; H01J 37/222; H01J 2237/2817; H01J 2237/2801; G06T 7/001;
(Continued)

(56) References Cited

U.S. PATENT DOCUMENTS

2016/0203945 A1* 7/2016 Foucher .............. G03F 7/70625
250/252.1

FOREIGN PATENT DOCUMENTS

FR    3 009 863 A1    2/2015

OTHER PUBLICATIONS

Babin, et al. (Fast analytical modeling of SEM images ata high level of accuracy), pp. 1-9. (Year: 2015).*
(Continued)

*Primary Examiner* — Daniel G Mariam
(74) *Attorney, Agent, or Firm* — Pillsbury Winthrop Shaw Pittman LLP

(57) ABSTRACT

A method for implementing a scanning electron microscopy characterisation technique for the determination of at least one critical dimension of the structure of a sample in the field of dimensional metrology, known as CD-SEM technique, the method including producing an experimental image representative of the structure of the sample and derived from a scanning electron microscope, from a first theoretical model based on parametric mathematical functions, calculating a second theoretical model obtained by algebraic summation of a corrective term, the corrective term being the convolution product between a given convolution kernel and the first theoretical model, the second theoretical model comprising a set of parameters to determine, and determining the set of parameters present in the second theoretical model by means of an adjustment between the second theoretical model and the experimental image.

10 Claims, 9 Drawing Sheets

(51) Int. Cl.
*H01J 37/22* (2006.01)
*H01J 37/28* (2006.01)

(52) U.S. Cl.
CPC .... *H01J 37/28* (2013.01); *G06T 2207/10061* (2013.01); *G06T 2207/30141* (2013.01); *G06T 2207/30148* (2013.01); *H01J 2237/2801* (2013.01); *H01J 2237/2817* (2013.01)

(58) Field of Classification Search
CPC ............... G06T 7/0006; G06T 7/60; G06T 2207/10061; G06T 2207/30141; G06T 2207/30148
USPC .......................................................... 382/141
See application file for complete search history.

(56) References Cited

OTHER PUBLICATIONS

Mack, C. A., et al., "Analytical Linescan Model for SEM Metrology," Metrology, Inspection, and Process Control for Microlitography XXIX, Proc. SPIE vol. 9424 (2015), 23 pages.

International Search Report as issued in International Patent Application No. PCT/EP2017/082427, dated Mar. 8, 2018.

Frase, C. G., et al., "CD characterization of nanostructures in SEM metrology," Institute of Physics Publishing, Meas. Sci. Techol., vol. 18, No. 2, Feb. 2007, XP020118520, pp. 510-519.

Yasui, N., et al., "Application of Model-Based Library Approach to Photoresist Pattern Shape Measurement in Advanced Lithography," SPIE—International Society for Optical Engineering, vol. 7638, Mar. 2010, XP055395427, 12 pages.

Levi, S., et al. "SEM Simulation for 2D and 3D Inspection Metrology and Defect Review," Optomechatronic Micro/Nano Devices and Components III, vol. 9051, Mar. 2014, XP060031041, 10 pages.

* cited by examiner

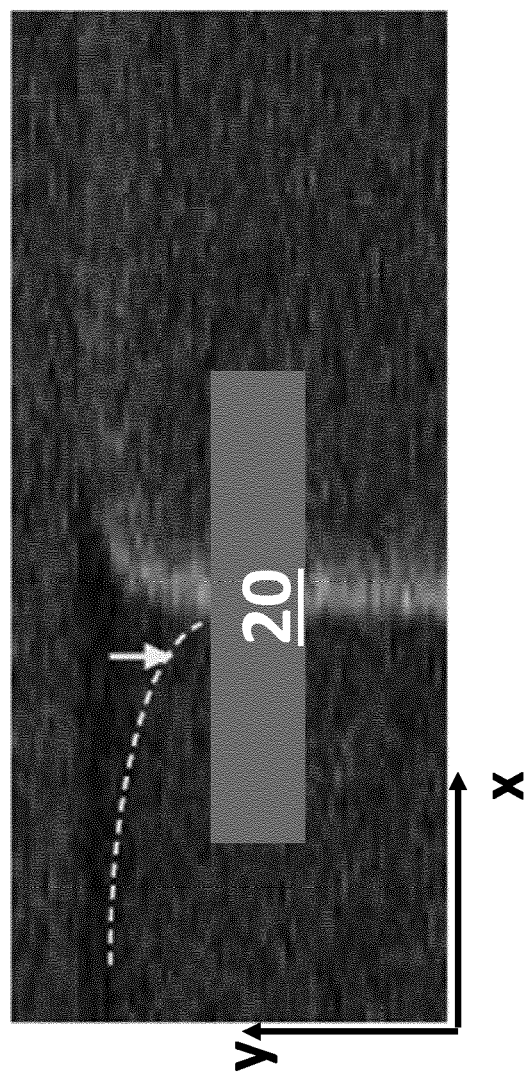
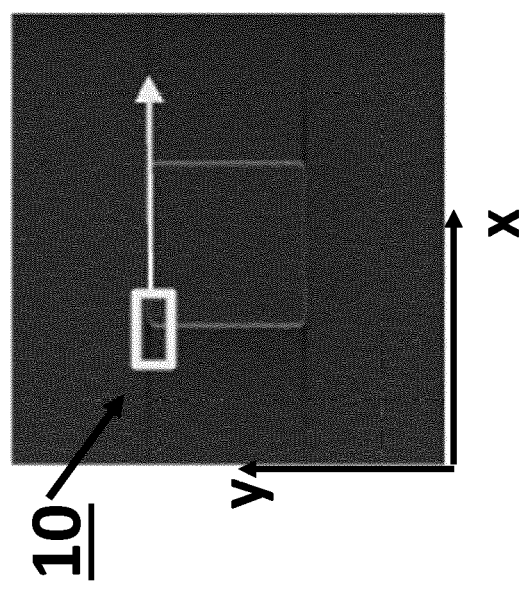
Figure 7a
Figure 7b

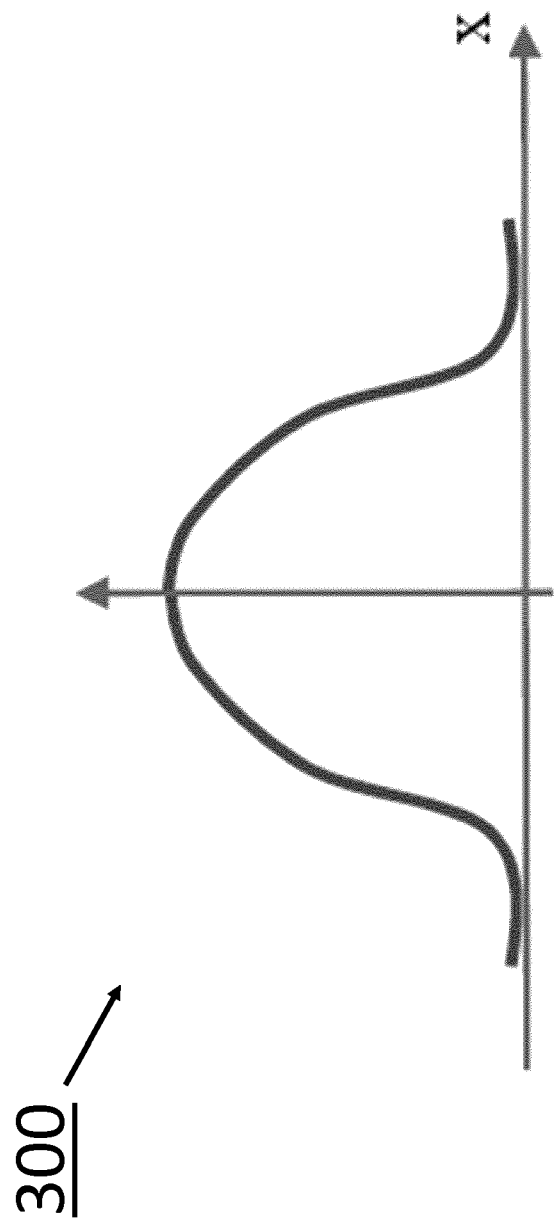

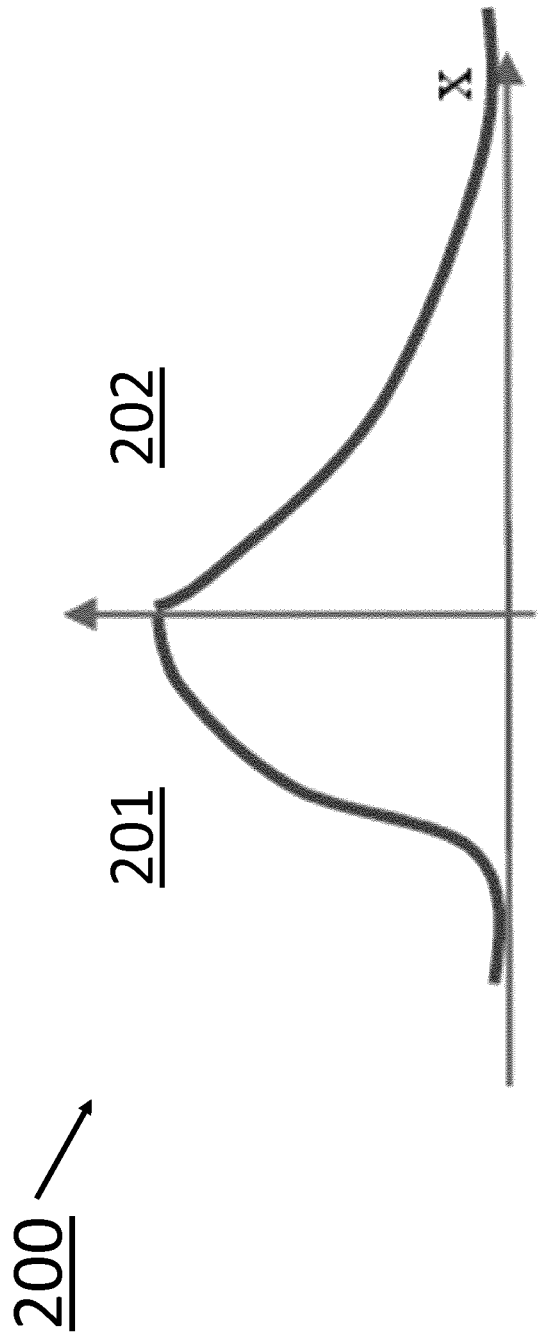

METHOD FOR IMPLEMENTING A CD-SEM CHARACTERISATION TECHNIQUE

CROSS REFERENCE TO RELATED APPLICATIONS

This application is the U.S. National Stage of PCT/EP2017/082427, filed Dec. 12, 2017, which in turn claims priority to French Patent Application No. 1662509 filed Dec. 15, 2016, the entire contents of all applications are incorporated herein by reference in their entireties.

FIELD

The present invention relates to the field of dimensional metrology and the subject matter of the invention is a method for implementing a scanning electron microscopy characterisation technique for the determination of a critical dimension, known as CD-SEM technique. CD-SEM techniques are today widely used for the characterisation of micrometric or nanometric structures such as, for example, the patterns used in printed circuits in microelectronics.

PRIOR ART

The characterisation of structures of micrometric or nanometric size is today of vital importance in the semiconductor industry, notably in microelectronics, and more generally in the nanotechnologies field. If the case of microelectronics is considered, the precise and reliable measurement of the characteristic dimensions of nanostructures is necessary throughout the different steps of the production process, from the research and development phase up to the production phase. In addition, the miniaturisation of microelectronic components requires ever more efficient characterisation tools.

The semiconductors industry defines the size of its products in terms of a characteristic size called critical dimension (CD). Critical dimension is taken to mean the critical dimension or dimensions of a pattern representing one or more characteristic lengths of the pattern which prove to be critical either for the control of the manufacturing method or to guarantee the electrical performances of the final electronic device constituted of said patterns. The reliable measurement of this critical dimension is today one of the main issues for scanning electron microscopy.

During the acquisition of an image by scanning electron microscopy, an electron beam, known as primary electron beam, scans the surface of a sample of interest. Each point of the surface is identified by a pair of spatial coordinates, for example cartesian coordinates (x, y). Collisions between primary electrons and atoms of the sample produce several physical phenomena which may be very complex. Among these phenomena there is the emission of secondary electrons and the emission of backscattered electrons. These electrons are captured by selective detectors near to the sample. Scanning the sample point by point results in the formation of an electronic image reflecting the different shapes and different materials of the sample. Hereafter, reference will be made to the different shapes of the sample and their different materials as to the structure of the sample.

The SEM image thereby obtained is a grey level image and the geometric measurements of the objects are determined by an analysis of the contours of the objects obtained after the choice of one or more thresholds. It is possible for example to reconstruct a graph as illustrated in FIG. 1 representing an intensity profile of secondary electrons PI comprising on the y-axis a percentage of collected secondary electrons and on the x-axis a dimension in nm representative of the scanning position. But one of the major problems is the interpretation of the images by thresholding algorithms: it is in fact the choice of this threshold that is going to determine the value of the characteristic size, or critical dimension, of interest. Yet the choice of the threshold is often arbitrary and the optimal choice is different for each object, notably as a function of the height of the patterns, the materials considered, the dimensions of the objects, the density of patterns, etc. Other types of algorithms are based not directly on the grey level but on the analysis of the shape of the intensity peaks and the choice of a threshold relative to the amplitude of the peaks. Here again, the choice of the threshold relative to the analysis of the peak is empirical. At present, it is known that CD-SEM techniques give not very reliable measurements for objects of size less than 100 nm (difference to reality from a nanometre to several nanometres). A fixed empirical threshold applied to any type of pattern is all the less satisfactory as there is no direct physical link between the percentage of collected secondary electrons and the real height of the pattern at which it is sought to determine the critical dimension. In other words, if a measurement at 80% of secondary electrons is carried out, that does not mean that a critical dimension is measured at 80% of the height of the pattern. An analysis of SEM images with a thresholding algorithm may thus readily distort the measurements of critical dimensions.

To overcome this problem, two approaches have been considered. The first is based on Monte Carlo type physical simulations. The implementation of this method requires the simulation of the physical processes of interaction between the primary electrons of the incident beam on the sample and the sample itself. Performing these very complex simulations requires great computing power and very long execution times. These characteristics make Monte Carlo type physical simulations generally not very accessible and very little suited to the processing of a large number of CD-SEM images. The second solution consists in performing a parametric mathematical modelling of the images; such a solution is notably described in the article "CD characterization of nanostructures in SEM metrology" (C. G. Frase, E. Buhr, and K. Dirscherl, Meas. Sci. Technol., vol. 18, no 2, p. 510, Feb. 2007). An example of such functions is illustrated in FIG. 2b for a pattern having a trapezoidal profile along the direction x, represented in FIG. 2a. These functions may be chosen according to a simple phenomenological model or instead by the analysis of preliminary Monte-Carlo modellings describing the formation of SEM images (more complex and precise but requiring long computing times). According to the example of FIG. 2, the pattern is broken down according to sections along the direction x (here six sections), each section corresponding to a particular shape function. The function M(x) may thereby be broken down as follows (into six functions according to each of the sections):

$$M(x) := \begin{cases} S0 + Ae^{\frac{x-x1}{t0}} & x < x1 \\ S1 - (S1 - S0 - A)e^{-\frac{x-x1}{t1}} & x1 \leq x \leq x2 \\ S2 + Ce^{-\frac{x-x2}{t2}} & x2 < x \leq x3 \\ S2 + De^{\frac{x-x4}{t3}} & x3 < x < x4 \\ S3 - (S3 - S0 - B)e^{\frac{x-x5}{t4}} & x4 \leq x \leq x5 \\ S0 + Be^{\frac{x5-x}{t5}} & x > x5 \end{cases}$$

Each of the six parametric functions reproduces the height of the profile of the sample as a function of the coordinate x in a certain range of values of x. The model presented above thus comprises a plurality of parameters: $x_1$, $x_2$, $x_3$, $x_4$, $x_5$, $S_0$, $S_1$, $S_2$, $S_3$, $t_0$, $t_1$, $t_2$, $t_3$, $t_4$, $t_5$, A, B, C, D. The existence of this set of parameters justifies the designation parametric mathematical function. Often, for applications in dimensional metrology, the most interesting parameters are those relating to the lateral dimensions of the pattern namely: $x_1$, $x_2$, $x_4$ and $x_5$.

Another method for parametric modelling of CD-SEM images is described in the article "Analytical Linescan Model for SEM Metrology" (C. A. Mack and B. D. Bunday, Metrology, Inspection and Process Control for Microlithography XXIX, Proc. SPIE Vol. 9424, 2015). According to this model, the function M(x) may be broken down as follows:

$$M(x) := \begin{cases} S0 \cdot \left(1 - \alpha_f \cdot e^{\frac{x}{\sigma_f}} - \alpha_b \cdot e^{\frac{x}{\sigma_b}}\right) & x < x1 \\ S1 + (S0 \cdot (1 - \alpha_f - \alpha_b) - S1) \cdot e^{-\frac{x}{d1}} + \\ (S2 \cdot (1 + \alpha_e - \alpha_v) - S1) \cdot e^{-\frac{(X2-x)}{d2}}) & x1 \le x \le x2 \\ S2 * \left(1 + \alpha_e \cdot e^{\frac{X2-x}{\sigma_e}} - \alpha_v \cdot e^{\frac{X2-x}{\sigma_v}}\right) & x > x2 \end{cases}$$

In this model the parameters are $S_0$, $S_1$, $S_2$, $\alpha_f$, $\alpha_b$, $\alpha_e$, $\alpha_v$, $\sigma_f$, $\sigma_b$, $\sigma_e$, $\sigma_v$, $d_1$, $d_2$, $X_2$.

In addition, in order to take account of the size of the primary electron beam, which is not zero, it is advisable to associate with the profile described by M(x) a convolution product including in the model the parameters describing the size and the shape of the beam. Usually, the profile of the primary electron beam is characterised using a Gaussian profile (point spread function or PSF), the parameter $\sigma_{PSF}$ being proportional to the full width at half maximum of the Gaussian. The parametric model thereby modified is calculated using the following formula:

$$M(x) = \int_{-\infty}^{+\infty} e^{-\frac{(x-x')^2}{2\sigma_{PSF}^2}} * M(x') dx'$$

Hereafter, the expression "set of parameters of the theoretical model" will refer to all of the parameters used in the mathematical formulation of the theoretical model. Among these parameters, some are used in the geometric description of the structure of the sample, others describe the instrumental response. A parametric function such as the function M(x) will be called hereafter model profile or parametric profile.

Another type of modelling consists in modelling the probability of emission of a secondary electron as a function of the material and the propagation of these electrons towards the detectors as a function of the angle of the detectors (see for example the AMAT type models, "SEM Simulation for 2D and 3D Inspection Metrology and Defect Review" of Shimon Levi, Ishai Schwarzband, Sergey Khristo, Yan Ivanchenko, Ofer Adan, Advances in Patterning Materials and Processes XXXI, 2014).

Simpler or more complex models may be elaborated as a function of the type of sample, the quality of the images, or a priori information on the materials or the profiles.

Once the modelling has terminated, it is necessary to resolve an inverse problem, namely the adjustment of the experimental data to the model by varying the parameters. One of the major limitations of these techniques is in their incapacity to take into account and to reproduce certain artefacts observed on CD-SEM images. This is for example the case of images acquired in so-called raster scan mode. These images show dark marks in the regions of the surface of the sample comprised between two or more neighbouring structures, such as the square or rectangular pads of FIG. 3a. In this figure the directions x and y are indicated, the direction x being that of scanning and the direction y being perpendicular to the direction x. More specifically these dark marks may be classified according to two types:

Rather linear marks in dark grey or in black in the extension of the horizontal edges aligned with the scanning direction and indicated by the mark 1 of FIG. 3a;

Surface marks in lighter grey along the patterns, still in the scanning direction and indicated by the mark 2 of FIG. 3a.

These dark marks are artefacts created during the process of forming the image.

It may be remarked that the parametric profiles method only takes account of a modelling of profiles along the direction perpendicular to the edges and is thus not able to reproduce the effects of black trails present in the extension of the edges themselves. It is interesting to note that, as illustrated in FIGS. 3b, 3c and 3d, the presence of the black trails increases when several structures close together are present. More specifically, FIG. 3b shows an isolated square structure. Dark traces are visible on the left and on the right of the structure, indicated by the mark $I_1$, with black trails in the extension of the horizontal edges. FIG. 3c shows an SEM image of three square structures close together and aligned along the horizontal direction. The dark marks, indicated by $I_2$, are more intense than in FIG. 3b. FIG. 3d shows an SEM image of a series of several square structures. The dark mark type artefacts along the scanning direction, indicated by $I_3$, are this time more intense than on the images 3b and 3c. These alterations cannot be described according to a purely local approach like that of parametric profiles.

TECHNICAL PROBLEM

In this context, the aim of the present invention is to improve the exploitation, by means of a parametric CD-SEM technique, of experimentally obtained CD-SEM images.

SUMMARY OF THE INVENTION

To this end, the invention provides a method for implementing a scanning electron microscopy characterisation technique for the determination of at least one critical dimension of the structure of a sample in the field of dimensional metrology, known as CD-SEM technique, said method comprising the following steps:

producing an experimental image representative of the structure of the sample and derived from a scanning electron microscope;

from a first theoretical model based on parametric mathematical functions, calculating a second theoretical model obtained by algebraic summation of a corrective term, said corrective term being the convolution product between a given convolution kernel and the first theoretical model, said second theoretical model comprising a set of parameters to be determined;

determination of the set of parameters present in the second theoretical model by means of an adjustment between said second theoretical model and said experimental image.

Critical dimension is taken to mean the critical dimension or dimensions of a pattern, that represents one or more characteristic lengths of the pattern which prove to be critical either for the control of the manufacturing method or to guarantee the electrical performances of the final electronic device constituted of said patterns.

Theoretical model based on parametric mathematical functions is taken to mean a mathematical representation of the structure of the sample, for example by one of the functions M(x) defined previously and described in detail in the articles "CD characterization of nanostructures in SEM metrology" (C. G. Frase, E. Buhr, and K. Dirscherl, Meas. Sci. Technol., vol. 18, n° 2, p. 510, Feb. 2007) or "Analytical Linescan Model for SEM Metrology" (C. A. Mack and B. D. Bunday, Metrology, Inspection and Process Control for Microlithography XXIX, Proc. SPIE Vol. 9424 2015) or AMAT for example.

Set of parameters present in the second theoretical model is taken to mean all of the parameters used in the mathematical formulation of the second theoretical model. This set of parameters includes both the parameters present in the first parametric theoretical model and the parameters present in the corrective term added during the calculation of the second theoretical model. In this set of parameters there will be some parameters that describe the geometry of the structure of the sample, some other parameters describing the instrumental response.

Adjustment between the second theoretical model and the experimental image is taken to mean an iterative calculation method aiming to find the set of parameters that minimises the difference between said model and said experimental image. In practice, this calculation method is for example implemented by computer by choosing one of the known algorithms for minimising the difference between the experimental image and the theoretical model, according for example to the so-called least squares method.

Generally speaking, the invention consists in obtaining the critical dimensions of the structure of the sample by means of an adjustment between an experimental image representative of the structure of the sample and a theoretical model, said theoretical model being computed in such a way as to take into account the artefacts present on the experimental images.

The aim of the invention is to obtain critical dimensions more efficiently and more precisely.

The method according to the invention is a method for implementing a CD-SEM characterisation technique that uses a modelling of the experimental images, said modelling being capable of describing, for example, alterations of intensity variation type in the extension of the edges that appear on the images. The intensity alterations are the result of phenomena that cannot be described according to a purely local approach like that of parametric profiles. Among the phenomena that can produce such alterations, one may cite for example charge accumulation ("charging") effects. These excess electric charges produce electric fields which can deviate the electrons (primary and secondary) and thus produce drops in the flow of secondary electrons corresponding to the black trails visible in FIGS. 3a to 3d. A more complex modelling of the CD-SEM images is thus required.

In order to take these effects into account, the method according to the invention modifies the parametric models by adding by algebraic summation a corrective term, said corrective term being a convolution product between the parametric model itself and a given convolution kernel. Thanks to the presence of the convolution product, this new model makes it possible to take into account the density of edges as well as their positioning with respect, for example, to the scanning direction of the primary electron beam. In addition, the choice of the convolution kernel makes it possible to adapt the method according to the invention to a wide variety of patterns and scanning methods.

The method according to the invention may also have one or more of the characteristics below, considered individually or according to all technically possible combinations thereof:

the second theoretical model is calculated according to the following formula:

$$\text{Img}(x,y) = G(x,y) - C \iint_{-\infty}^{+\infty} F(x',y') * [G(x',y') - \overline{G}_0] dx' dy'$$

in which:

(x,y) are the spatial coordinates associated with each point of the image along the two orthogonal directions x and y;

G(x,y) is the first theoretical model based on parametric mathematical functions;

Img(x,y) is the second theoretical model obtained by the application of the corrective term;

F(x,y) is the given convolution kernel;

$\overline{G}_0$ is the background of the intensities present on the experimental image;

C is an adjustment constant;

the primary electron beam scans the surface of the sample along a straight line designated x axis or horizontal axis according to the so called TV or raster scan method, the scanning direction being the horizontal direction or x axis;

the convolution kernel may take a mono-dimensional symmetrical shape, through for example a Gaussian taken along the x axis, said Gaussian having a full width at half maximum proportional to sigma according to the following formula:

$$\text{Img}(x, y) = G(x, y) - C \int_{-\infty}^{+\infty} e^{-\frac{(x-x')^2}{2\sigma^2}} * [G(x', y) - \overline{G}_0] dx'$$

the convolution kernel may take a two-dimensional symmetrical shape, through for example two Gaussians taken respectively by the x' and y' axes respectively parallel and normal to the scanning direction of the primary electron beam according to the following formula:

$$\text{Img}(x, y) = G(x, y) - C \iint_{-\infty}^{+\infty} e^{-\frac{(x-x')^2}{2\sigma_x^2}} e^{-\frac{(y-y')^2}{2\sigma_y^2}} * [G(x', y') - \overline{G}_0] dx' dy'$$

the convolution kernel may take a one-dimensional shape asymmetric along the scanning direction of the primary electron beam.

the convolution kernel may take a two-dimensional shape asymmetric along the scanning direction of the primary electron beam.

the method is implemented to calibrate the CD-SEM characterisation technique, said calibration comprising the following steps:

producing an experimental image representative of the structure of a reference sample of which the geometric dimensions are known, said image derived from a scanning electron microscope;

from a first theoretical model based on parametric mathematical functions, calculating a second theoretical model obtained by algebraic summation of a corrective term, said corrective term being the convolution product between a given convolution kernel and the first theoretical model, said second theoretical model comprising a set of parameters, said set of parameters including both the known parameters which describe the geometric structure of the reference sample and the parameters to be determined which describe the instrumental response;

determination of the parameters present in the second theoretical model and describing the instrumental response by means of an adjustment between said second theoretical model and said experimental image representative of the structure of the reference sample.

The method for implementing a CD-SEM characterisation technique advantageously comprises the following steps:

producing an experimental image representative of the structure of the sample and derived from a scanning electron microscope from a first theoretical model based on parametric mathematical functions, calculating a second theoretical model obtained by algebraic summation of a corrective term, said corrective term being the convolution product between a given convolution kernel and the first theoretical model, said second theoretical model comprising a set of parameters, said set of parameters including both the parameters to be determined which describe the geometric structure of the sample of interest and the parameters determined by the calibration described above which describe the instrumental response;

determination of the parameters present in the second theoretical model and describing the structure of the sample of interest by means of an adjustment between said second theoretical model and said experimental image.

LIST OF FIGURES

Other characteristics and advantages of the invention will become clear from the description that is given thereof below, for indicative purposes and in no way limiting, with reference to the appended figures, among which:

FIG. 1 schematically illustrates an intensity profile of secondary electrons as a function of the profile of a pattern obtained via a CD-SEM type instrumentation;

FIG. 5b represents a parametric theoretical model of the image 5a;

FIG. 7a represents an experimental CS-SEM image;

FIG. 7b shows an enlargement of a portion of FIG. 7a illustrating a particular local effect in correspondence with a corner in the structure of the sample;

FIG. 8 illustrates an example of symmetrical profile of the convolution kernel;

FIG. 9 illustrates an example of asymmetric profile of the convolution kernel.

DETAILED DESCRIPTION

Figure 1:
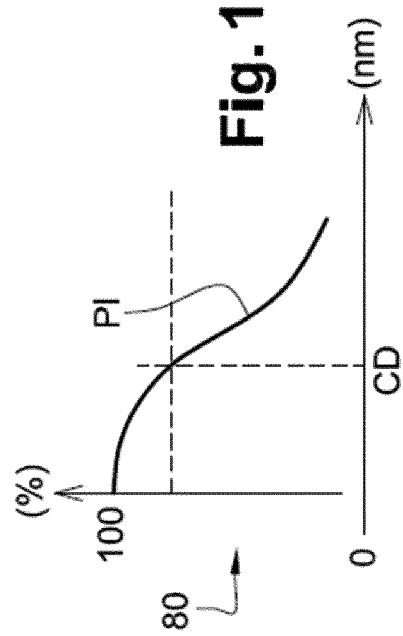
Figure 2:
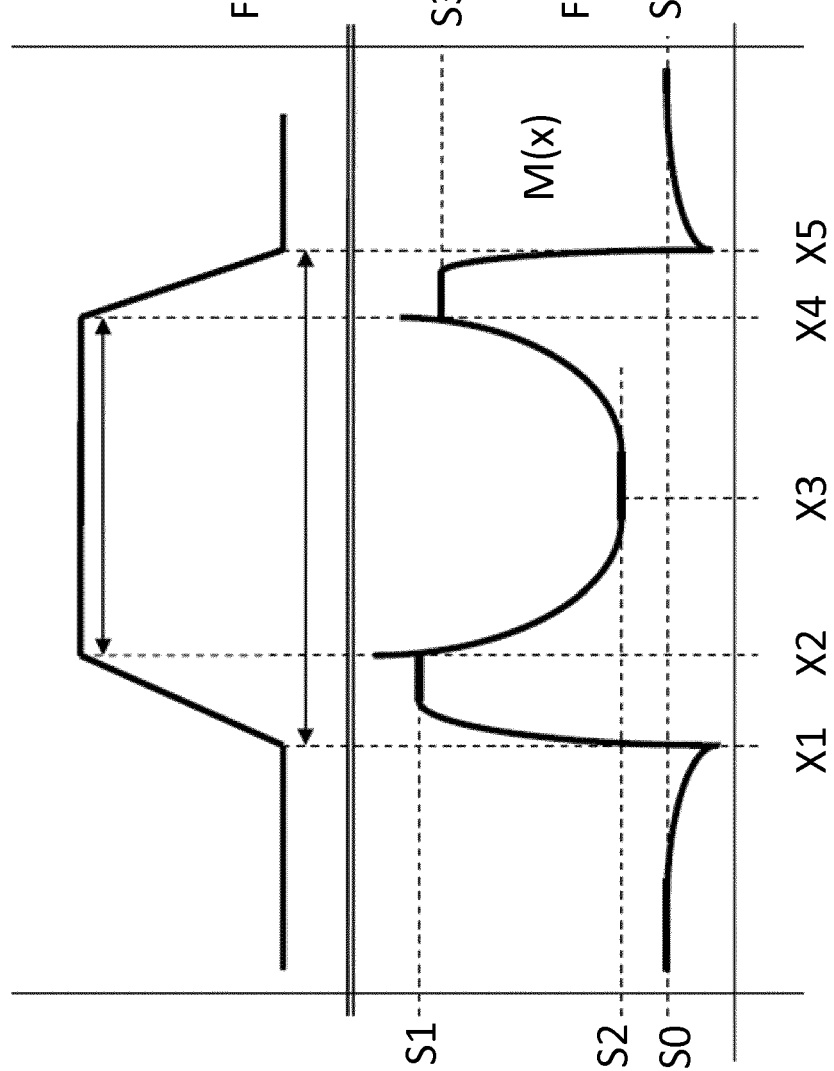
FIGS. 2a and 2b illustrate an example of parametric mathematical modelling of a CS-SEM image.
Figure 3:
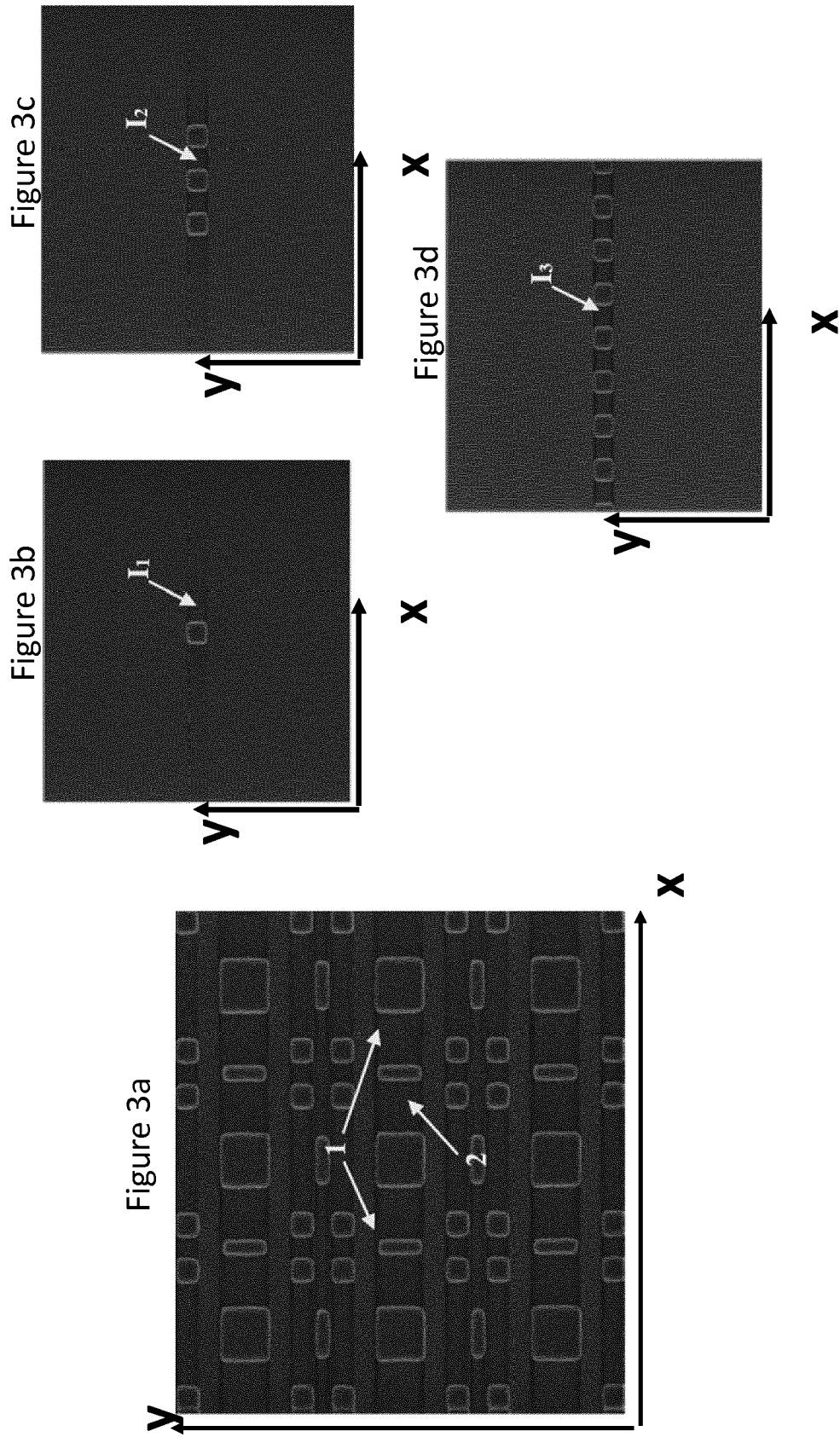
FIGS. 3a, 3b, 3c and 3d illustrate examples of dark mark type artefacts observed on experimental CD-SEM images.
Figure 4:
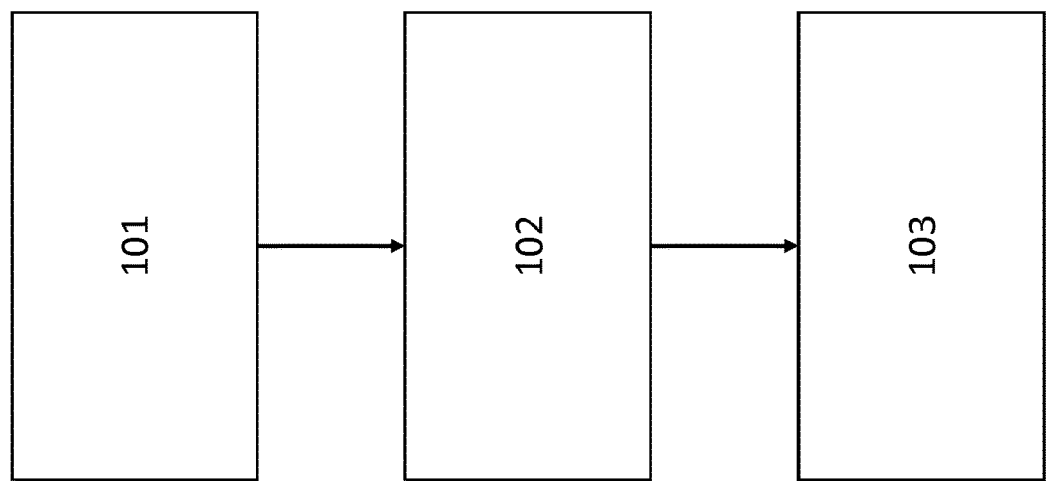
FIG. 4 represents the different steps of the method according to the invention.

FIG. 4 schematically illustrates the different steps of the method 100 according to the invention.

The method 100 according to the invention targets the implementation of a scanning electron microscopy characterisation technique for the determination of at least one critical dimension of the structure of a sample in the field of dimensional metrology. One application may be for example the measurement of a critical dimension of a pattern forming a printed circuit in microelectronics. The shape of the pattern may be any shape. The material of the pattern may also be any material. This pattern may for example be an isolated pattern or belong to a network of patterns repeated periodically. It may be a pattern obtained after any step (lithography, etching, etc.) of a manufacturing method.

A step 101 of the method 100 according to the invention consists in producing an image representative of the structure of the sample and derived from a scanning electron microscope.

Figure 6D:
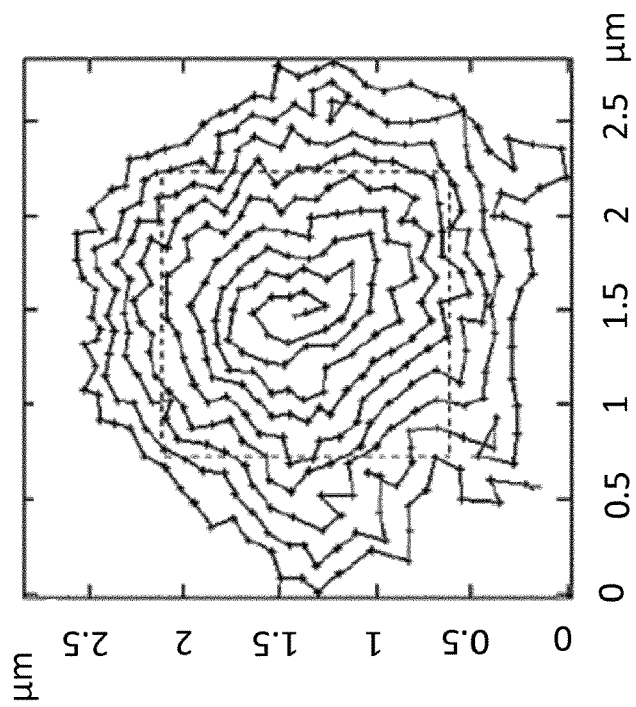
FIG. 6d illustrates the scanning method adapted to the objects measured.
Figure 6A:
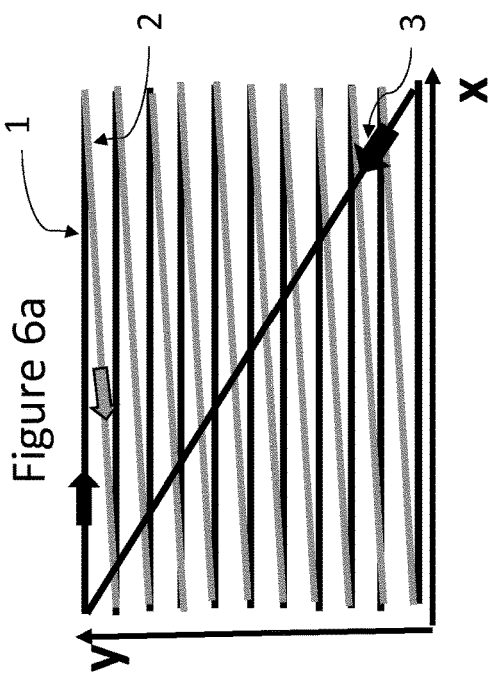
FIG. 6a illustrates the so-called TV scan (raster scan) method.

According to a preferential embodiment of step 101 according to the invention, the primary electron beam scans the sample according to the so-called raster scan method. This scanning mode is represented by FIG. 6a. According to this scanning mode it is possible to identify a rapid scanning direction along the direction x indicated in FIG. 6a and a slow scanning direction along the direction y indicated in FIG. 6a. According to this scanning method, data acquisition takes place only in correspondence with the horizontal lines, indicated (1) in FIG. 6a. Hereafter, the rapid scanning direction, x in FIG. 6a, will refer to the scanning direction of the primary electron beam.

Figure 6C:
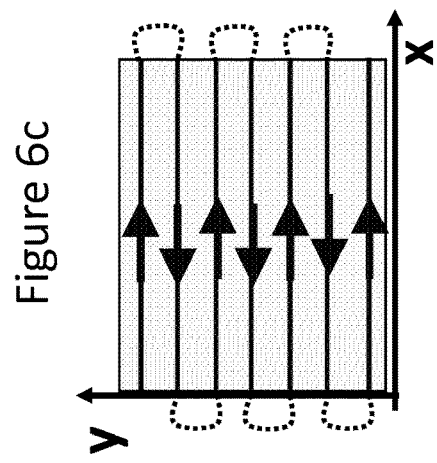
FIG. 6c illustrates the two-directional scanning method.
Figure 6B:
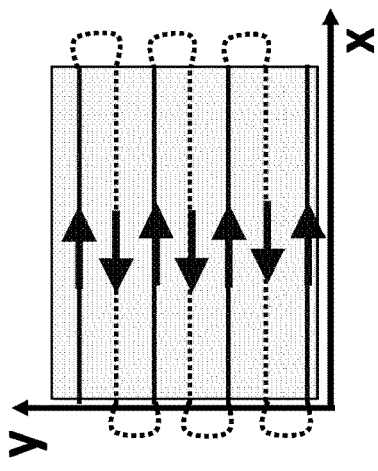
FIG. 6b illustrates the sawtooth scanning method.

According to another embodiment of step 101 according to the invention, the primary electron beam scans the sample according to the so-called sawtooth method. This scanning mode is represented by FIG. 6b. In this figure, the solid line represents the data acquisition phase (thus formation of the image), the dotted line designating the phase of simple displacement of the primary electron beam without data acquisition. The grey arrows represent the scanning direction of the primary electron beam.

According to another embodiment of step 101 according to the invention, the primary electron beam scans the sample according to the so-called bi-directional method. This scanning mode is represented by FIG. 6c. In this figure, the solid line represents the data acquisition phase (thus formation of the image). Unlike FIGS. 6a and 6b, in this case the acquisition of data is made by scanning the surface both in the direction of increasing values of the coordinate x and in the direction of decreasing values of the coordinate x. The grey arrows represent the scanning direction of the primary electron beam.

According to another embodiment of step 101 according to the invention, the primary electron beam scans the sample according to a method adapted to the shape of the objects to characterise. This scanning mode is represented by FIG. 6d.

According to a step 102 of the method 100 according to the invention, from a parametric theoretical model of the surface of the sample a second theoretical model is calculated capable of taking into account dark mark type alterations of intensity, such as those present in the extension of the edges and often having the shape of black trails.

More specifically, step 102 of the method 100 according to the invention comprises the modification of a first theoretical model called G(x, y) to obtain a second theoretical model called Img(x, y). The model G(x, y) is a parametric model of the response of the microscope to the structure of the sample obtained for example by one of the methods described in the articles "CD characterization of nanostructures in SEM metrology" (C. G. Frase, E. Buhr, and K. Dirscherl, Meas. Sci. Technol., vol. 18, n° 2, p. 510, Feb. 2007) or "Analytical Linescan Model for SEM Metrology" (C. A. Mack and B. D. Bunday, Metrology, Inspection and Process Control for Microlitography XXIX, Proc. SPIE Vol. 9424 2015) or AMAT or other. The function G(x, y) thus represents a theoretical image of the structure of the sample without effects linked to the scanning direction. For example, the theoretical image without scanning effect G(x, y) is obtained by the application of the model M(δ(x, y)) where δ(x, y) is the signed distance to the edges of the imaged object. Like the function M(x), this theoretical model contains a set of parameters to be determined and that represent both information on the geometry of the sample and on the instrumental response without the scanning direction taken into account.

Next the second theoretical model, Img(x, y), is calculated. Said second theoretical model is obtained by algebraic summation of a corrective term to the first theoretical model, said corrective term being a convolution product between a given convolution kernel and the first theoretical model.

According to an embodiment of step 102 of the method 100 according to the invention, the second theoretical model is calculated according to the following formula $$Img(x,y)=G(x,y)-C\iint_{-\infty}^{+\infty}F(x',y')*[G(x',y')-\overline{G}_0]dx'dy'$$

In which:
G(x,y) is the first theoretical model based on parametric mathematical functions;
(x,y) are the spatial coordinates associated with each point of the image along the two orthogonal directions x and y;
Img(x,y) is the second theoretical model obtained by the application of the corrective term;
F(x,y) is the given convolution kernel;
$\overline{G}_0$ is the background of the intensities present on the experimental image;
C is an adjustment constant.

An advantage of this embodiment arises in the formula (1) of the convolution product calculated between the kernel F(x, y) and the difference G(x', y')–$\overline{G}_0$. The subtraction of the background intensity $\overline{G}_0$ in fact makes it possible to cancel the convolution product where the response is constant, and thus the corrective term, when G(x', y')=$\overline{G}_0$. This condition is verified for the points of the surface of the sample that are far away from the patterns, thus for portions of the image on which the black trails are not present and for which the correction is not necessary.

Generally speaking, the convolution kernel F(x, y) is a function of the spatial coordinates (x,y) or instead spatial coordinates chosen according to any coordinates system.

The present invention may be implemented with any function F(x,y), providing that the result of formula (1) presented above is well defined. As an example, according to the different embodiments of the present invention, symmetrical, asymmetrical or anisotropic convolution kernels may be used.

According to an embodiment of step 102 of the method 100 according to the invention, the electron beam scans the surface of the sample according to the so-called raster scan method illustrated by FIG. 6a.

According to an embodiment of step 102, the convolution kernel is a mono-dimensional symmetrical function along one direction of space. FIG. 8 shows an example of symmetrical kernel 300 in the sense of the invention.

According to an embodiment of step 102, the convolution kernel is a Gaussian taken along the x axis, said x axis corresponding to the scanning direction of the primary electron beam, said Gaussian having a full width at half maximum proportional to sigma, according to the following formula:

$$Img(x, y) = G(x, y) - C\int_{-\infty}^{+\infty} e^{-\frac{(x-x')^2}{2\sigma^2}} * [G(x', y) - \overline{G}_0]dx'$$

It may be remarked in this case that the convolution kernel F(x',y') is a constant function along the vertical direction y', which explains why the variable y' does not appear in the convolution product.

An advantage of this embodiment is to be particularly suited to taking into account drops in intensity in the extension of the edges in the horizontal direction in the case of scanning in raster scan mode.

According to an embodiment of step 102 of the method 100 according to the invention, the convolution kernel is a symmetrical two-dimensional function.

According to an embodiment of step 102 of the method 100 according to the invention, the convolution kernel is symmetrical in the directions respectively parallel and normal to the scanning direction of the primary electron beam according to the following formula:

$$Img(x, y) = G(x, y) - C\iint_{-\infty}^{+\infty} e^{-\frac{(x-x')^2}{2\sigma_x^2}} e^{-\frac{(y-y')^2}{2\sigma_y^2}} * [G(x', y') - \overline{G}_0]dx'dy'$$

An advantage of this embodiment is to be able to choose a convolution kernel capable of taking into account particular local effects, for example those in correspondence with the corners of the patterns forming the structure of the sample. FIGS. 7a and 7b illustrate an example of these effects. FIG. 7a is a CS-SEM image of a square shaped structure. FIG. 7b represents an enlargement of the framed portion 10 of FIG. 7a. This figure illustrates a particular example of dark mark indicated by the dashed line 20. More specifically, a dependency in y, which is added to the dependency in x, may be recognised. These observations motivate the necessity of a two-dimensional and potentially anisotropic convolution kernel along the two orthogonal directions x and y. Anisotropic convolution kernel is taken to mean a two-dimensional function having a profile in x different from the profile in y (for example a two-dimensional Gaussian with width $\sigma_x$ different from the width $\sigma_y$).

Another advantage of this embodiment is to be able to be adapted to a different scanning method from the raster scan mode.

According to an embodiment of step 102 of the method 100 according to the invention, the convolution kernel has an asymmetric profile along at least one of the directions x or y. An example is illustrated by FIG. 9 which illustrates an example of asymmetric convolution kernel 200 along the x axis. In this case there is, for example, a profile that is in part Gaussian 201 and in part decreasing according to a non-Gaussian dependency in x 202.

An advantage of this embodiment is to be able to adapt the convolution kernel to the scanning mode employed and to the type of patterns present on the sample.

According to a step 103 of the method 100 according to the invention, the adjustment between the formula (1) and the experimental image is carried out. This adjustment makes it possible to find the set of parameters present in (1) that minimises the differences between the theoretical model and the experimental image, for example by using one of the known algorithms that apply the least squares method. Like the model G(x,y), the model Img(x,y) contains several parameters, including the parameters describing the geometry of the sample and used to deliver the critical dimension of interest.

According to an embodiment of step 103 of the method according to the invention, a calibration step is carried out to determine the parameters present in the model and linked to the instrumental response. These parameters form part of the set of parameters already present in the first theoretical model and they take into account, for example, the fact that the primary electron beam has a non-zero size. Often the shape of the primary electron beam is described as a Gaussian profile. This Gaussian function taking into account the characteristics of the primary electron beam is called "point spread function" or PSF. The parameters describing the instrumental response, for example the parameters of the PSF function, may advantageously be determined during a preliminary calibration step. The calibration is obtained by carrying out an adjustment between the formula (1) and the experimental image of a sample of which the structure is known. This makes it possible to fix the geometric parameters during the calibration step and to obtain in a more reliable manner the parameters describing the instrumental response. The values of the parameters describing the instrumental response will next be fixed during the implementation of the CD-SEM technique for the characterisation of an experimental image of interest.

Figure 5C:
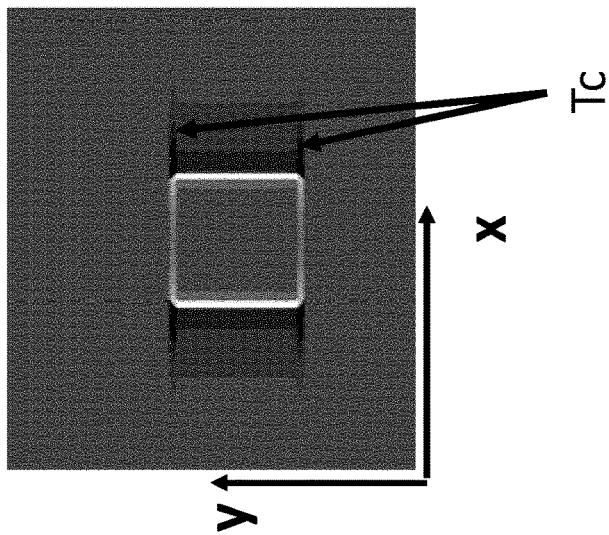
FIG. 5c represents a theoretical model of the image 5a obtained by application of the method according to the invention.
Figure 5B:
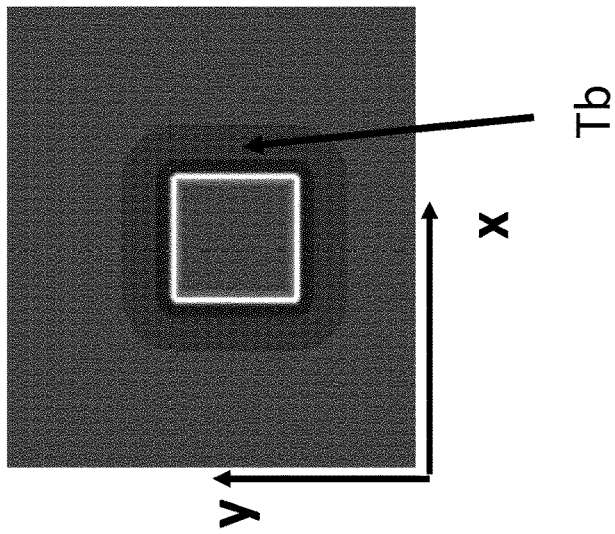
Figure 5A:
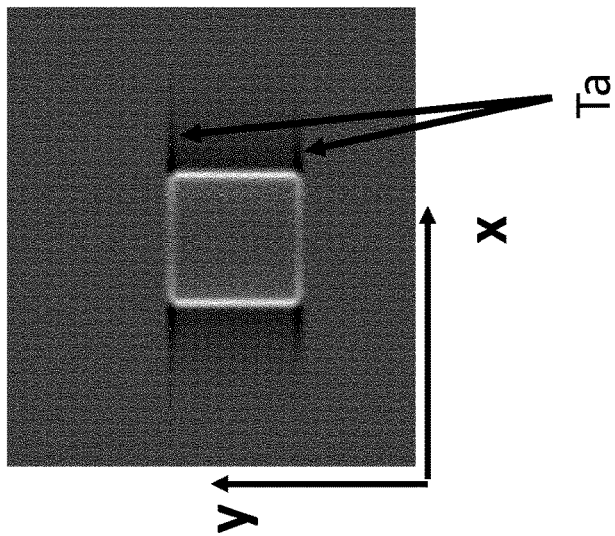
FIG. 5a represents a CS-SEM image.

An advantage of carrying out the calibration step is to be able to determine in a more precise and reliable manner the parameters describing the instrumental response. Next these parameters describing the instrumental response will be fixed during the implementation of the CD-SEM technique for the characterisation of an experimental image of interest, which makes it possible to attain a more precise and reliable determination of the parameters describing the structure of the sample and thus the critical dimensions of interest FIGS. 5a to 5c illustrate the effects obtained thanks to the method according to the invention. FIG. 5a is a CD-SEM image of a sample that it is wished to be characterised. In this example the case of a scanning in raster scan mode is considered. According to this scanning mode, illustrated in FIG. 6a, the primary electron beam rapidly scans the surface of the sample along the direction x and more slowly along the direction y. In this case, the direction x is simply designated as the scanning direction of the primary electron beam. The mark Ta indicates the black trails in the extension of the horizontal edges, along the scanning direction. These artefacts are very frequent on CD-SEM images obtained with this scanning method. FIG. 5b represents the theoretical model of the CS-SEM image based on parametric functions, which have been designated G(x, y) above. The mark Tb indicates the dark marks that are predicted by this type of model. It may be seen in this figure how the intensity of these dark marks is uniquely dependent on the distance to the edges. In addition, no black trail of the type indicated by the arrows Ta is present. FIG. 5c represents the theoretical model of the CS-SEM image calculated by means of the method according to the invention, using the following formula:

$$Img(x, y) = G(x, y) - C \int_{-\infty}^{+\infty} e^{-\frac{(x-x')^2}{2\sigma^2}} * [G(x', y) - \overline{G}_0] dx'$$

The convolution kernel chosen in this case is a one-dimensional Gaussian taken along the x axis. The image 5c derived from the method according to the invention reproduces the characteristics of the experimental image 5a in a more precise manner with respect to the theoretical model derived from the parametric functions (image 5b). More specifically, in image 5c may be seen black trails, indicated by the arrows Tc, which reproduce the black trails observed on the CS-SEM image 5a. These images show how the method according to the invention reproduces precisely the dark mark type artefacts or black trails in the extension of the edges along the scanning direction of the primary electron beam.

The implementation of the method according to the invention shown in FIGS. 5a, 5b and 5c may also be accompanied by a calibration step making it possible to obtain in a precise manner the parameters describing the instrumental response of the scanning electron microscope. To do so, it is necessary to acquire beforehand an experimental CD-SEM image of a reference sample of which the geometric dimensions are known. This image is the reference image for the calibration step. An adjustment between the second theoretical model and the reference image is next carried out, by fixing the geometric parameters, which are known in the case of the reference sample. This adjustment makes it possible to obtain the values of the parameters describing the instrumental response, for example the parameters of the PSF, or the amplitude of the signals. The fact of having fixed the geometric parameters during this calibration step makes it possible to obtain in a more reliable and precise manner the parameters describing the instrumental response. The values of said parameters describing the instrumental response will next be fixed during the implementation of the method according to the invention on a sample of interest.

The invention claimed is:
1. Method for implementing a scanning electron microscopy characterisation technique for the determination of at least one critical dimension of the structure of a sample in the field of dimensional metrology, known as CD-SEM technique, said method comprising:

producing an experimental image representative of the structure of the sample and derived from a scanning electron microscope;

from a first theoretical model based on parametric mathematical functions, calculating a second theoretical model obtained by algebraic summation of a corrective term, said corrective term being the convolution product between a given convolution kernel and the first theoretical model, said second theoretical model comprising a set of parameters to be determined, the first and second theoretical models being a mathematical representation of the structure of the sample in the experimental image;

determining the set of parameters present in the second theoretical model by means of an adjustment between said second theoretical model and said experimental image, the adjustment corresponding to a minimisation of a difference between said second theoretical model and said experimental image.

2. The method according to claim 1, wherein the second theoretical model is calculated according to the following formula:

$$Img(x,y)=G(x,y)-C\iint_{-\infty}^{+\infty}F(x',y')*[G(x',y')-\overline{G}_o]dx'dy'$$

in which:

(x,y) are the spatial coordinates associated with each point of the image along the two orthogonal directions x and y;

G(x,y) is the first theoretical model based on parametric mathematical functions;

Img(x,y) is the second theoretical model obtained by the application of the corrective term;

F(x,y) is the given convolution kernel;

$\overline{G}_o$ is the background of the intensities present on the experimental image;

C is an adjustment constant.

3. The method according to claim 2, wherein the convolution kernel is a symmetrical one-dimensional function and wherein the convolution kernel is a Gaussian taken along the x axis, said Gaussian having a full width at half maximum proportional to sigma according to the following formula:

$$Img(x, y) = G(x, y) - C\int_{-\infty}^{+\infty} e^{-\frac{(x-x')^2}{2\sigma^2}} *[G(x', y) - \overline{G}_0]dx'.$$

4. The method according to claim 2, wherein the convolution kernel is a two-dimensional symmetrical function and wherein the convolution kernel is two-dimensional symmetrical in the directions respectively parallel and normal to the scanning direction of the primary electron beam according to the following formula:

$$Img(x, y) = G(x, y) - C\iint\int_{-\infty}^{+\infty} e^{-\frac{(x-x')^2}{2\sigma_x^2}} e^{-\frac{(y-y')^2}{2\sigma_y^2}} *[G(x', y') - \overline{G}_0]dx'dy'.$$

5. The method according to claim 1, wherein a primary electron beam scans a surface of the sample according to a TV or raster scan method, the scanning direction being the horizontal direction or x axis.

6. The method according to claim 1, wherein the convolution kernel is a symmetrical one-dimensional function.

7. The method according to claim 1, wherein the convolution kernel is a two-dimensional symmetrical function.

8. The method according to claim 1, wherein the convolution kernel has a mono-dimensional profile asymmetric along the scanning direction of the primary electron beam or a two-dimensional profile asymmetric along the scanning direction of the primary electron beam.

9. The method according to claim 1, said method being implemented for a calibration of the CD-SEM characterisation technique, said calibration comprising:

producing an experimental image representative of the structure of a reference sample of which the geometric dimensions are known, said experimental image derived from a scanning electron microscope;

wherein said set of parameters of the second theoretical model include both the known parameters which describe the geometric structure of the reference sample and the parameters to be determined which describe an instrumental response;

determining the parameters present in the second theoretical model and describing the instrumental response by means of an adjustment between said second theoretical model and said experimental image representative of the structure of the reference sample.

10. Method for implementing a CD-SEM characterisation technique, said method comprising:

producing a first experimental image representative of a structure of a sample of interest and derived from a scanning electron microscope;

from a first theoretical model based on parametric mathematical functions, calculating a second theoretical model obtained by algebraic summation of a corrective term, said corrective term being the convolution product between a given convolution kernel and the first theoretical model, said second theoretical model comprising a set of parameters, said set of parameters including both parameters to be determined which describe a geometric structure of the sample of interest and parameters determined according to the calibration according to claim 9 which describes the instrumental response;

determining the parameters present in the second theoretical model and describing the structure of the sample of interest by means of an adjustment between said second theoretical model and said first experimental image.

* * * * *